United States Patent
Nakamura

(10) Patent No.: US 8,701,734 B2
(45) Date of Patent: Apr. 22, 2014

(54) SEPARATING APPARATUS AND SEPARATING METHOD

(75) Inventor: Akihiko Nakamura, Kawasaki (JP)

(73) Assignee: Tokyo Ohka Kogyo Co., Ltd, Kawasaki-Shi, Kanagawa (JP)

( * ) Notice: Subject to any disclaimer, the term of this patent is extended or adjusted under 35 U.S.C. 154(b) by 0 days.

(21) Appl. No.: 12/453,816

(22) Filed: May 22, 2009

(65) Prior Publication Data

US 2009/0314430 A1 Dec. 24, 2009

(30) Foreign Application Priority Data

Jun. 24, 2008 (JP) ................................. 2008-164664

(51) Int. Cl.
- *B32B 38/10* (2006.01)
- *H01L 21/687* (2006.01)

(52) U.S. Cl.
CPC ............................. H01L 21/68728 (2013.01)
USPC ........... 156/758; 156/701; 156/714; 156/716; 156/717; 156/761; 156/762

(58) Field of Classification Search
CPC ................... H01L 21/67092; H01L 21/67011; H01L 21/6838; H01L 21/68728
USPC ...................................................... 156/941
See application file for complete search history.

(56) References Cited

U.S. PATENT DOCUMENTS

| | | | | |
|---|---|---|---|---|
| 1,242,392 A * | 10/1917 | Underwood | ...................... | 81/3.7 |
| 2,444,097 A * | 6/1948 | Grant | ............................. | 254/100 |
| 5,171,398 A * | 12/1992 | Miyamoto | .................... | 156/552 |
| 5,343,012 A * | 8/1994 | Hardy et al. | .................. | 118/725 |
| 5,447,596 A | 9/1995 | Hayase | .......................... | 156/584 |
| 5,897,743 A * | 4/1999 | Fujimoto et al. | .............. | 156/584 |
| 6,074,163 A | 6/2000 | Yamazaki et al. | ......... | 414/795.5 |
| 6,272,989 B1 * | 8/2001 | Misono et al. | ................. | 101/474 |
| 6,336,787 B1 * | 1/2002 | Chang et al. | .................. | 414/800 |
| 6,491,083 B2 * | 12/2002 | De et al. | ........................ | 156/584 |
| 6,653,205 B2 * | 11/2003 | Yanagita et al. | .............. | 438/455 |
| 6,792,991 B2 * | 9/2004 | Thallner | ....................... | 156/539 |
| 7,052,934 B2 * | 5/2006 | Kurimoto et al. | ............. | 438/106 |
| 7,150,804 B2 * | 12/2006 | Tajima | .......................... | 156/344 |
| 7,736,462 B2 * | 6/2010 | Weichart | .................. | 156/345.51 |
| 2004/0144487 A1 * | 7/2004 | Martinez et al. | .............. | 156/344 |
| 2005/0173064 A1 * | 8/2005 | Miyanari | ...................... | 156/344 |
| 2007/0062644 A1 | 3/2007 | Nakamura et al. | ............ | 156/344 |
| 2007/0119893 A1 * | 5/2007 | Rayssac et al. | ..................... | 225/2 |
| 2007/0122926 A1 * | 5/2007 | Martinez et al. | ................ | 438/34 |
| 2008/0230183 A1 * | 9/2008 | Yamamoto et al. | ........... | 156/538 |
| 2011/0146899 A1 | 6/2011 | Nakamura et al. | ............ | 156/247 |

FOREIGN PATENT DOCUMENTS

| | | | | |
|---|---|---|---|---|
| JP | 1-319938 | 12/1989 | ............ | H01L 21/304 |
| JP | 6-268051 | 9/1994 | ............ | H01L 21/68 |
| JP | 11-59895 | 3/1999 | ............ | B65G 49/06 |
| JP | 11-111824 A | 4/1999 | | |
| JP | 11-116046 A | 4/1999 | | |
| JP | 2006-32506 A | 2/2006 | | |
| JP | 2007-67167 | 3/2007 | ............ | H01L 21/683 |

* cited by examiner

*Primary Examiner* — Mark A Osele
*Assistant Examiner* — Nickolas Harm
(74) *Attorney, Agent, or Firm* — Harness, Dickey & Pierce, P.L.C.

(57) ABSTRACT

A separating apparatus according to the present invention includes a clamp for gripping an outer peripheral end of a supporting plate. The clamp grips the outer peripheral end of the supporting plate and separates the supporting plate from a wafer by gripping the supporting plate. This makes it possible to separate a supporting plate from a wafer without breaking the wafer. With this, a supporting plate can be separated from a wafer to which the supporting plate has been attached, without breaking the wafer.

7 Claims, 4 Drawing Sheets

SEPARATING APPARATUS AND SEPARATING METHOD

This Nonprovisional application claims priority under 35 U.S.C. §119(a) on Patent Application No. 2008-164664 filed in Japan on Jun. 24, 2008, the entire contents of which are hereby incorporated by reference.

TECHNICAL FIELD

The present invention relates to a separating apparatus and a separating method by each of which a supporting plate is separated from a substrate to which the supporting plate has been attached.

BACKGROUND ART

As mobile phones, digital AV devices, IC cards and the like are highly functionalized, there is a growing demand for miniaturizing and thinning semiconductor silicon chips (hereafter referred to as "chips") to be mounted and thereby highly integrating the chips in a package. In order to fulfill high integration of chips in a package, it is necessary to reduce the thickness of each chip to a range of 25 to 150 μm.

However, a semiconductor wafer (hereafter referred to as "wafer") on which chips are based is thinned by grinding, and therefore decreases in strength. The decrease in strength is likely to cause a crack or a warpage in the wafer. Furthermore, it is difficult to automatically convey such a wafer having decreased in strength due to a decrease in thickness. Therefore, it is necessary to manually convey the wafer, and it is troublesome to handle the wafer.

For this reason, a wafer support system has been developed for keeping the strength of a wafer by attaching a support plate to a wafer to be ground and for thereby preventing a crack and a warpage in the wafer. The "support plate" here means a plate composed of glass, hard plastic, or the like. The wafer support system makes it possible to keep the strength of a wafer. This makes it possible to automatically convey a semiconductor wafer having been made thinner.

A support plate is attached to a wafer with use of an adhesive tape, a thermoplastic resin, an adhesive, or the like. After the wafer to which the support plate has been attached is made thinner, the support plate is separated from the wafer before the wafer is diced. In cases where the wafer is separated from the support plate, the wafer is usually separated from the support plate by ripping down the wafer from the support plate or by dissolving the resin or the adhesive with which the wafer has been attached to the support plate.

For example, Japanese Patent Application Publication, Tokukaihei, No. 11-111824 A (Publication Date: Apr. 23, 1999) discloses a method for separating a wafer from a support plate by inserting a blade edge of a scraper between the wafer and the support plate and moving the blade edge of the scraper along a surface of the support plate so as to remove an adhesive with which the wafer has been attached to the support plate. Furthermore, Japanese Patent Application Publication, Tokukai, No. 2006-32506 A (Publication Date: Feb. 2, 2006) discloses a method for separating a wafer from a support plate while preventing adhesion between the wafer and the support plate due to closure of an interface where the support plate is separated from the wafer, by inserting a blade into an adhesive material with which the support plate has been attached to the wafer and vibrating the adhesive material while biasing the wafer in a direction away from the support plate.

When a support plate is separated from a wafer having been made thinner, it is necessary to be careful not to break the wafer having been made thinner. However, since both of the methods disclosed in Japanese Patent Application Publication, Tokukaihei, No. 11-111824 A and Japanese Patent Application Publication, Tokukai, No. 2006-32506 A involve the insertion of a blade between a wafer and a support plate, it is highly possible that the wafer will be broken when the blade is inserted. Moreover, an extremely high level of location accuracy is required for securely inserting a blade between a wafer having been made thinner and a support plate. Therefore, there is a demand for the development of an apparatus capable of easily separating a support plate from a wafer without breaking the wafer.

The present invention has been made in consideration of the aforementioned problems. It is an object of the present invention to provide a separating apparatus and a separating method by each of which a support plate can be separated from a wafer to which the support plate has been attached.

SUMMARY OF INVENTION

A separating apparatus for separating a supporting plate from a substrate to which the supporting plate has been attached, comprises: gripping means for gripping an outer peripheral end of the supporting plate.

A separating method for separating a supporting plate from a substrate to which the supporting plate has been attached, comprises the steps of: dissolving an adhesive with which the supporting plate has been attached to the substrate; and separating the supporting plate from the substrate after the dissolving step by gripping an outer peripheral end of the supporting plate.

For a fuller understanding of the nature and advantages of the invention, reference should be made to the ensuing detailed description taken in conjunction with the accompanying drawings.

DESCRIPTION OF EMBODIMENTS

Embodiment 1

(Separating Apparatus 1)

Figure 1:
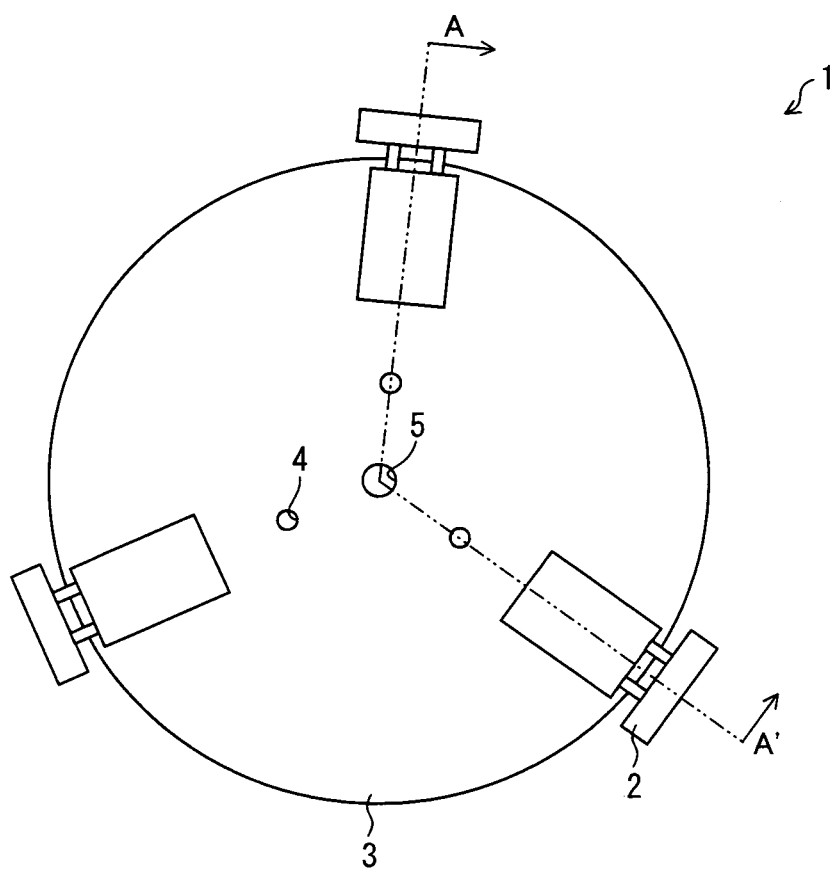
FIG. 1 is a top view of a separating apparatus according to Embodiment 1.
Figure 2:
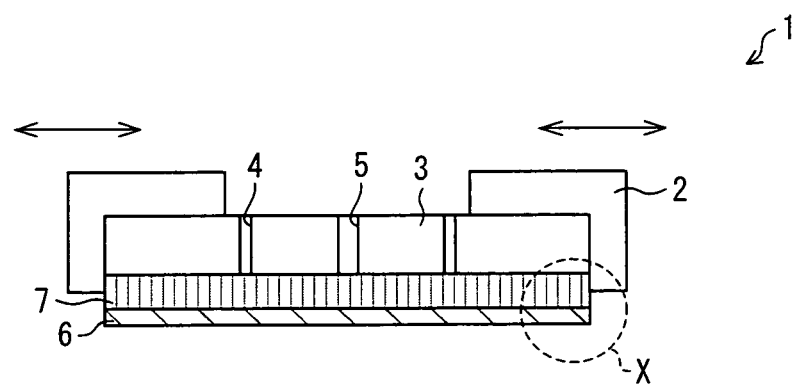
FIG. 2 is a cross-sectional view taken along the line A-A' of FIG. 1.
Figure 3:
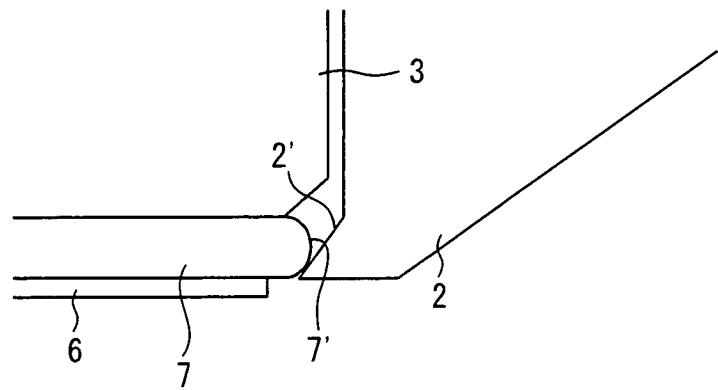
FIG. 3 is an enlarged view of the region X of FIG. 2.

A separating apparatus 1 according to an embodiment of the present invention is described below with reference to FIGS. 1 to 4. FIG. 1 is a top view of a separating apparatus 1 according to Embodiment 1. FIG. 2 is a cross-sectional view of the separating apparatus of FIG. 1 taken along the line A-A' line. FIG. 3 is an enlarged view of the region X of FIG. 2. Furthermore, in FIG. 4, (a) to (g) are cross-sectional views illustrating steps of a separating method according to the present embodiment. As illustrated in FIGS. 1 and 2, the separating apparatus 1 includes a clamp (gripping means) 2.

Moreover, as illustrated in FIGS. 1 and 2, the separating apparatus 1 may include a sucking plate (sucking means) 3. The sucking plate 3 is provided with a sucking hole (opening) 4 and gas supply means having a gas inlet 5. As illustrated in FIG. 2, the separating apparatus 1 is provided so as to face a support plate (supporting plate) 7, attached to a wafer (substrate) 6, which is an object to be processed.

(Clamp 2)

The clamp 2 grips an outer peripheral end of the support plate 7 and separates the support plate 7 from the wafer 6. As illustrated in FIG. 2, the clamp 2 grips only the support plate 7 attached to the wafer 6 and does not make contact with the wafer 6. It is only necessary that the clamp 2 grip the outer peripheral end of the support plate 7. However, it is particularly preferable that the clamp 2 grip a chamfered portion 7' of the outer peripheral end of the support plate 7. The support plate 7 for supporting the wafer 6 is usually realized by a glass plate or the like, and such a plate has an outer peripheral end chamfered so as to be curved. By gripping this chamfered portion 7', the clamp 2 more securely grips the support plate 7.

A state where the clamp 2 grips the chamfered portion 7' of the support plate 7 is more specifically described with reference to FIG. 3. The clamp 2 in the present embodiment, as illustrated in FIG. 3, includes a claw 2' that makes contact with the chamfered portion 7' of the support plate 7. The clamp 2 grips the support plate 7 in such a way as to hook the claw 2' onto the chamfered portion 7'.

In order for the claw 2' to be securely hooked onto the chamfered portion 7', it is preferable that a surface of the claw 2' which surface makes contact with the chamfered portion 7' be inclined at 45 to 90 degrees, more preferably at approximately 60 degrees, to a contact surface of the chamfered portion 7' which contact surface makes contact with the claw 2'. Moreover, as illustrated in FIG. 3, it is preferable that (i) a surface of the claw 2' opposite to the surface that makes contact with the chamfered portion 7', i.e., a lower surface of the claw 2' and (ii) a surface of the support plate 7 which surface has been attached to the wafer 6 be in the same plane (flush with each other). This makes it possible to grip only the support plate 7 without hooking the claw 2' onto the wafer 6 or a dicing tape attached to the wafer.

The clamp 2 moves toward or away from the outer peripheral end of the support plate 7 in a direction (direction of an arrow illustrated in FIG. 2) parallel to the surface of the support plate 7 which surface has been attached to the wafer 6. When the support plate 7 is separated from the wafer 6, the clamp 2 moves toward the outer peripheral end of the support plate 7 in the direction parallel to the aforementioned surface to grip the outer peripheral end. Such a configuration allows suitably gripping support plates 7 of various sizes.

The separating apparatus 1 may further include driving means (not illustrated) for moving the clamp 2 as mentioned above. Such driving means is not particularly limited provided that the clamp 2 can be moved toward or away from the outer peripheral end of the support plate 7 in the direction parallel to the aforementioned surface, but can be suitably realized, for example, by a cylinder.

It is preferable here that the driving means be controlled so that the clamp 2 is at a displacement angle of not more than 0.02 with a direction orthogonal to the surface of the support plate 7 which surface has been attached to the wafer 6. Such a setting allows more suitably gripping the outer peripheral end of the support plate 7. The driving means is stopped when: the clamp 2 is moved toward the support plate 7; the claw 2' of the clamp 2 makes contact with the outer peripheral end of the support plate 7; the claw 2' is hooked onto the chamfered portion 7' to grip the support plate 7.

Here, when the force with which the claw 2' makes contact with the outer peripheral end of the support plate 7 and grips the chamfered portion 7' is too strong, the support plate 7 might be broken. Therefore, the driving means is controlled so that the claw 2' makes contact with the support plate 7 with suitable force. In cases where a cylinder is used as the driving means, regulation of the driving pressure of the cylinder with use of a regulator or the like makes it possible to control the force with which the claw 2' makes contact with the outer peripheral end of the support plate 7 and grips the support plate 7.

In the present embodiment, as illustrated in FIGS. 1 and 2, the clamp 2 is provided at an outer peripheral end of the sucking plate 3. The clamp 2 is moved toward the support plate 7 in a position where the respective centers of the sucking plate 3 and the support plate 7 are substantially aligned. It is preferable that the claw 2' be rotatably arranged so that the claw 2' of the clamp 2 makes accurate contact with the outer peripheral end of the support plate 7 even if the respective centers of the sucking plate 3 and the support plate 7 are out of alignment when the clamp 2 is moved toward the support plate 7. With such a configuration, for example, in cases where the respective centers of the sucking plate 3 and the support plate 7 are out of alignment and the claw 2' holds the support plate 7 by making contact with only one spot on the outer peripheral end of the support plate 7, the position of the claw 2' can be adjusted by rotating the claw 2' so that the claw 2' holds the support plate 7 by making contact with two spots on the outer peripheral end of the support plate 7.

Furthermore, in the present embodiment, as illustrated in FIG. 1, there are three clamps 2 provided on the sucking plate 3 at regular intervals. There may be provided two clamps or four or more clamps. The number of clamps 2 is not limited provided that the support plate 7 can be stably gripped. Accordingly, the separating apparatus 1 is arranged such that the plurality of clamps 2 grip the outer peripheral end of the support plate 7 from multiple directions so as to pinch the support plate 7.

The separating apparatus 1 separates the support plate 7 from the wafer 6 by moving the clamp 2, which is gripping the outer peripheral end of the support plate 7, away from the wafer 6. Moreover, the separating apparatus 1 may further include dissolving liquid supply means (not illustrated) for supplying a dissolving liquid for dissolving an adhesive with which the support plate 7 has been attached to the wafer 6. The separating apparatus 1 is arranged to separate the support plate 7 from the wafer 6 by causing the clamp 2 to grip the outer peripheral end of the support plate 7 at which the adhesive has been dissolved by the dissolving liquid supplied by the dissolving liquid supply means.

(Sucking Plate 3)

The sucking plate 3, which has a contact surface that makes contact with the support plate 7, holds the support plate 7 by suction. It is preferable that the contact surface of the sucking plate 3 be substantially identical in planar shape to the support plate 7. As illustrated in FIGS. 1 and 2, the sucking plate 3 is provided with the sucking hole 4 via which gas is sucked from a space between the contact surface of the sucking plate 3 and the support plate 7. In the present embodiment, the sucking hole 4 is a through hole passing through the sucking plate 3. The sucking hole 4 is connected to decompression means (not illustrated) such as a vacuum pump. The decompression means is operated to suck the gas from the space between the contact surface of the sucking plate 3 and the support plate 7, whereby the space between the contact surface of the sucking plate 3 and the support plate 7 is decompressed. This makes it possible to stick to the support plate 7 by suction.

As illustrated in FIG. 1, in the present embodiment, there are three sucking holes 4 provided in the sucking plate 3. The number of sucking holes 4 is not limited provided that the support plate 7 can be held by suction. Furthermore, as illustrated in FIG. 1, it is preferable that the sucking hole 4 be provided in the vicinity of the center of the sucking plate 3. However, the position of the sucking hole 4 is not limited to this provided that the support plate 7 can be stably held by suction.

In separating the support plate 7 from the wafer 6, the separating apparatus 1 uses the sucking plate 3 to hold the support plate 7 by suction and then uses the clamp 2 to grip the outer peripheral end of the support plate 7 held by the sucking plate 3. That is, the separating apparatus 1 supports the support plate 7 by moving the clamp 2 toward the outer peripheral end of the support plate 7 and sticking the sucking plate 3 to the support plate 7 by suction before using the clamp 2 to grip the support plate 7.

In this way, stress on the wafer 6 due to bending of the support plate 7 at the time of separation can be prevented by holding the support plate 7 on the outer peripheral side and in the vicinity of the center of the support plate 7. Moreover, the sucking plate 3 sticks to the support plate 7 by suction by decompressing a space between a sucking surface of the sucking plate 3 and the support plate 7. Therefore, whether or not the support plate 7 has been held can be easily detected by measuring pressure between the sucking surface and the support plate.

In the present embodiment, the support plate 7 has a plurality of through holes passing therethrough in a thickness direction thereof. Gas to be supplied to the support plate 7 via the gas inlet 5 of the gas supply means provided on the sucking plate 3 is supplied into a space between the support plate 7 and the wafer 6 via the through holes of the support plate 7. By supplying the gas into the space between the support plate 7 and the wafer 6 via the gas inlet 5, surface tension therebetween can be removed. It is preferable that the separating apparatus 1 be arranged such that after or at the same time as the gas supply means starts supplying the gas, the clamp 2 grips the outer peripheral end of the support plate 7 and separates the support plate 7 from the wafer 6. This makes it possible to easily separate the support plate 7 from the wafer 6.

The gas to be supplied via the gas inlet 5 is not particularly limited provided that it is a gas capable of applying a certain pressure between the support plate 7 and the wafer 6 when blown therebetween, but is preferably an inert gas. The inert gas can be suitably realized by a publicly-known inert gas such as nitrogen or argon. As for a method for supplying the gas via the gas inlet 5, it is preferable to supply the gas at such a flow rate that the wafer 6 is not broken. Furthermore, the gas supply means having the gas inlet 5 does not need to be provided in the sucking plate 3, but may be included in the separating apparatus 1 as independent gas supply means provided that the gas can be supplied into the space between the support plate 7 and the wafer 6.

Moreover, in the present embodiment, the support plate 7 is provided with a sucked section (not illustrated) to which the sucking plate 3 sticks by suction. The sucked section has no such through hole formed therein. In the sucked section, the space between the contact surface and the support plate 7 is decompressed, whereby the support plate 7 can be held by suction. On the support plate 7, in order for the sucking plate 3 to hold the sucked section by suction, the sucked section is provided so as to face the sucking hole 4, preferably to be in a circular pattern centered at the center of the support plate 7.

The separating apparatus 1 according to the present embodiment is arranged such that: the clamp 2 grips the outer peripheral end of the support plate 7; and the clamp 2 gripping the support plate 7 is moved in a direction away from the wafer 6. This allows easily separating the support plate 7 without putting stress on the wafer 6, and preventing the wafer from being broken when the support plate 7 is separated.

(Separating Method)

Figure 4:
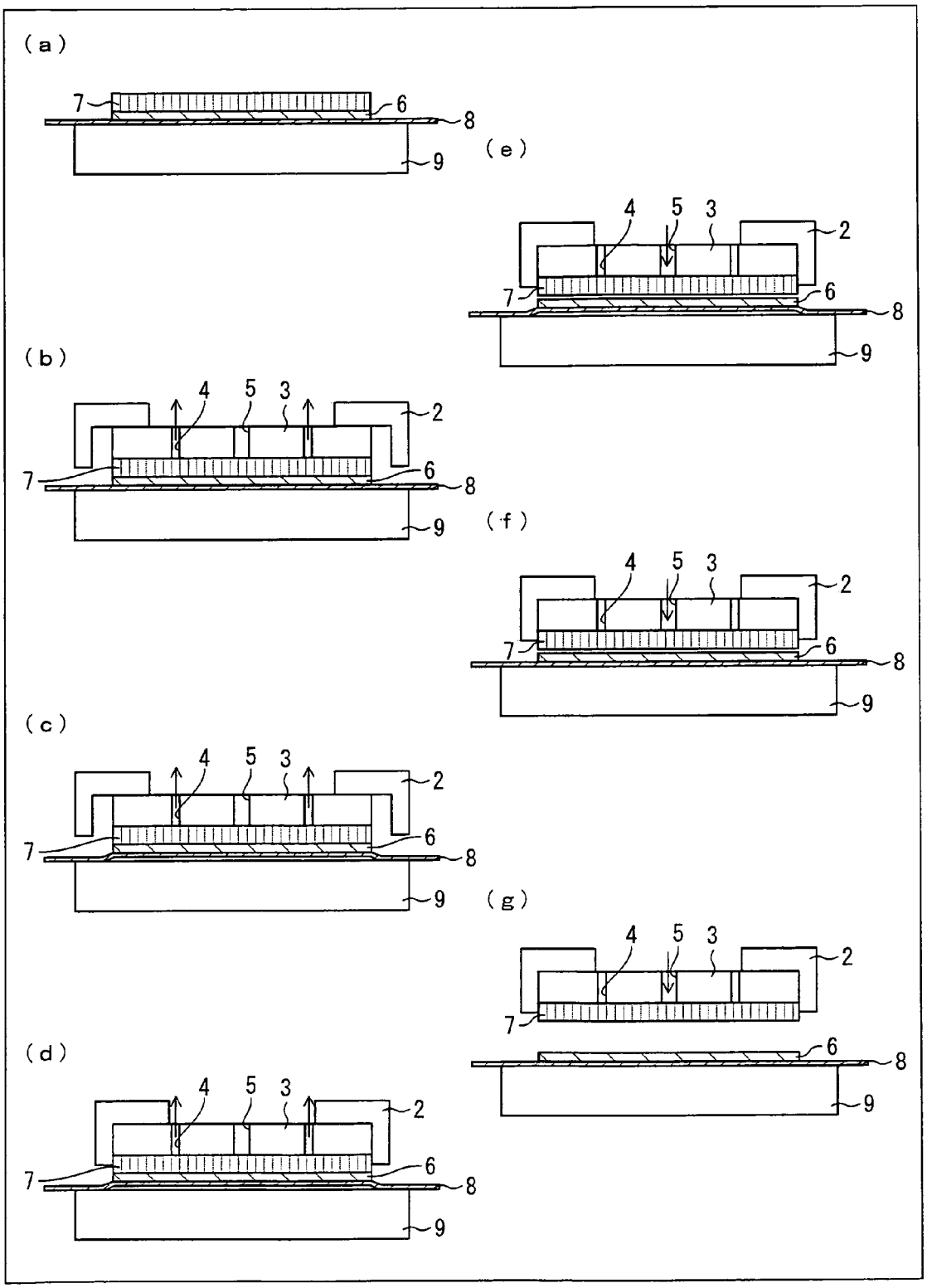
FIG. 4 is a cross-sectional view illustrating steps of a separating method according to Embodiment 1.

A separating method according to the present embodiment is described below with reference to (a) to (g) of FIG. 4. In FIG. 4, (a) to (g) are cross-sectional views illustrating steps of the separating method according to the present embodiment. The separating method according to the present embodiment includes at least the steps of: dissolving an adhesive with which the support plate 7 has been attached to the wafer 6; and separating the support plate 7 from the wafer 6 after the dissolving step by gripping an outer peripheral end of the support plate 7. Moreover, it is preferable that the separating method further includes the step of supplying gas into a space between the wafer 6 and the support plate 7 after the dissolving step. In this case, in the separating step, the support plate 7 is separated from the wafer 6 after or at the same time as the gas starts being supplied in the supplying step.

In the present separating method, as illustrated in (a) in FIG. 4, the wafer 6 to which the support plate 7 has been attached is mounted on a stage 9. At this time, the adhesive with which the support plate 7 has been attached to the wafer 6 is dissolved by a dissolving liquid infused thereinto. The dissolution of the adhesive can be realized, for example, by infusing the dissolving liquid from an upper side of the support plate 7 (i.e., a side of the support plate 7 opposite to the wafer 6) via a through hole (not illustrated). It should be noted here that "the dissolution of the adhesive" also encompasses a case where the adhesive is partially dissolved, as well as a case where the adhesive is completely dissolved.

Furthermore, to a surface of the wafer 6 opposite to its surface that is in contact with the support plate 7, a dicing tape 8 is attached. The dicing tape 8 is a member for holding a substrate. A laminate constituted by the wafer 6, the support plate 7, and the dicing tape 8 is mounted on the stage 9 so that the dicing tape 8 makes contact with the stage 9 and the support plate 7 is located farthest from the stage 9. This laminate is fixed on the stage 9. Specifically, the dicing tape 8 in contact with the stage 9 is held by decompression suction.

Next, as illustrated in (b) in FIG. 4, the sucking plate 3 on which the clamp 2 has been provided is placed above the support plate 7 so that the support plate 7 and the contact surface of the sucking plate 3 face each other. Then, the support plate 7 and the sucking plate 3 are brought into contact with each other, and the support plate 7 is fixed to the sucking plate 3 by decompression suction. Specifically, the sucking plate 3 and the support plate 7 are brought into contact with each other so that the sucking hole 4 overlaps with a position on the support plate 7 where no through hole is provided, and then gas is exhausted in a direction of an arrow illustrated in (b) in FIG. 4 via the sucking hole 4, whereby a space between the sucking plate 3 and the support plate 7 is decompressed and the support plate 7 is held by suction.

Subsequently, as illustrated in (c) in FIG. 4, the decompression suction of the dicing tape 8 is partially released. Specifically, the sticking of an inner peripheral side of the stage 9 by decompression suction is released. By this, that portion of the dicing tape 8 which is located so as to correspond to the inner peripheral side of the stage 9 is slightly raised from the stage 9. This can be realized by stopping the operation of decompression means (e.g., a vacuum pump) of the stage 9. At this time, decompression means on an outer peripheral side of the stage 9 remains operated and thus the sticking between the dicing tape 8 and the outer peripheral side of the stage 9 by decompression suction is continued.

Then, as illustrated in (d) in FIG. 4, the clamp 2 grips the outer peripheral end of the support plate 7. Specifically, the clamp 2 is moved toward the outer peripheral end of the support plate 7 and stopped in a position where the claw 2' of the clamp 2 makes contact with the chamfered portion 7' of the outer peripheral end of the support plate 7. The clamp 2 grips the support plate 7 in such a way as to hook the claw 2' onto the chamfered portion 7'.

Next, as illustrated in (e) in FIG. 4, gas is supplied into the space between the wafer 6 and the support plate 7 via the gas inlet 5, which is the gas supply means. Specifically, an inert gas such as nitrogen is supplied into the space between the wafer 6 and the support plate 7 via the gas inlet 5 in a direction of an arrow illustrated in (e) in FIG. 4. At this time, the support plate 7 is securely gripped by the clamp 2, and the sticking of the sucking plate 3 to the support plate 7 by suction is released. With this step, the surface tension between the wafer 6 and the support plate 7 can be removed.

Subsequently, as illustrated in (f) in FIG. 4, the dicing tape 8 is fixed to the stage 9 again by suction. Specifically, the sticking of the inner peripheral side of the stage 9 by suction is started. With this step, the support plate 7 gripped by the clamp 2 is spaced from the wafer 6.

Then, as illustrated in (g) in FIG. 4, the clamp 2 gripping the support plate 7 and the sucking plate 3 are lifted. With this, the wafer 6 and the support plate 7 are completely spaced and thus the support plate 7 can be separated from the wafer 6. In this step, the clamp 2 gripping the support plate 7 and the sucking plate 3 are lifted, for example, by an arm connected to the sucking plate 3.

Embodiment 2

(Separating Apparatus 10)

Figure 5:
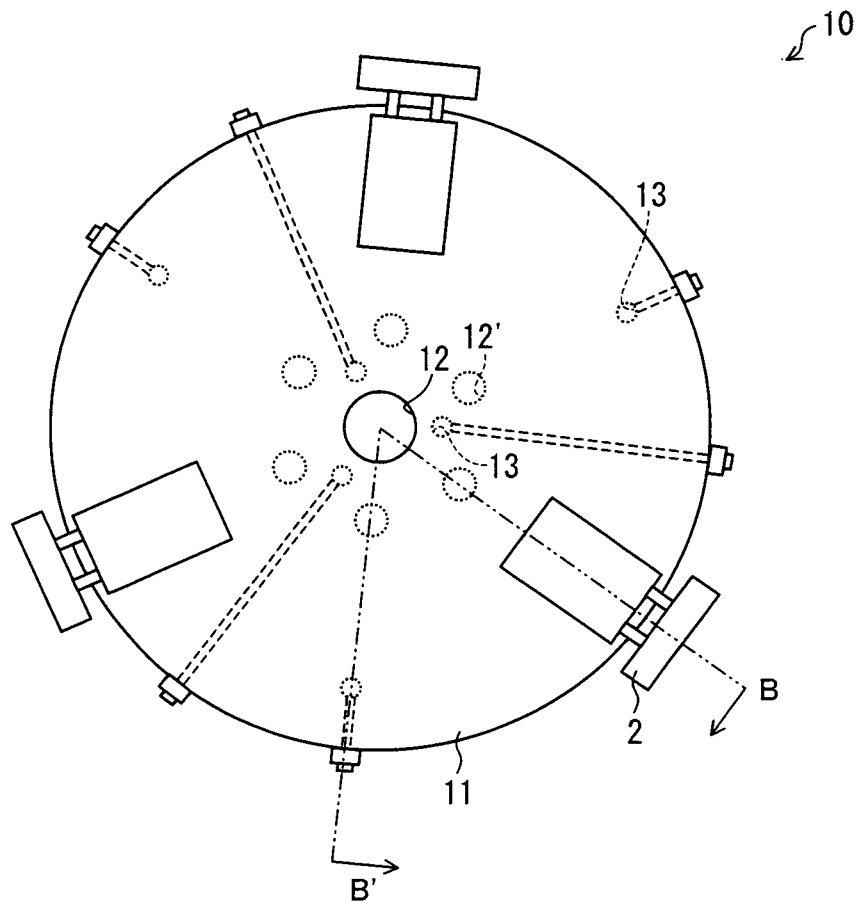
FIG. 5 is a top view of a separating apparatus according to Embodiment 2.
Figure 6:
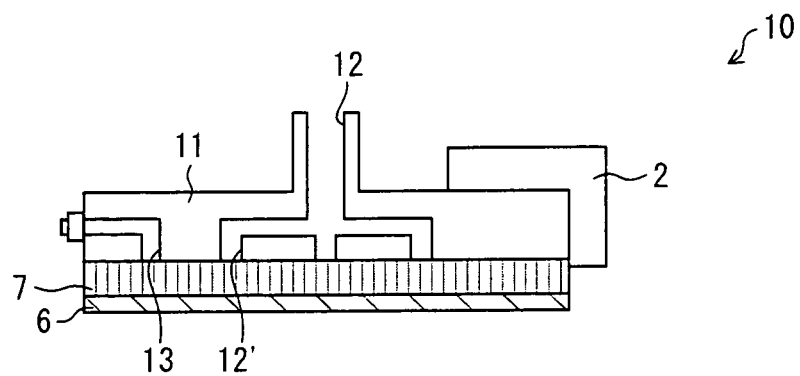
FIG. 6 is a cross-sectional view taken along the line B-B' of FIG. 5.

A separating apparatus 10 according to another embodiment of the present invention is described below with reference to FIGS. 5 and 6. FIG. 5 is a top view of the separating apparatus 10 according to Embodiment 2. FIG. 6 is a cross-sectional view taken along the line B-B' line of FIG. 5. As illustrated in FIGS. 5 and 6, the separating apparatus 10 includes a sucking plate 11. The sucking plate 11 is provided with sucking holes 12 and 12' and gas supply means having a gas inlet 13. The sucking holes 12 and 12' are provided so as to pass through the sucking plate 11 so that the sucking hole 12 is communicated with the sucking hole 12' provided in a surface of the sucking plate 11 which surface makes contact with the support plate 7. As illustrated in FIG. 6, the separating apparatus 10 is provided so as to face the support plate 7, attached to the wafer 6, which is an object to be processed. In the present embodiment, the clamp 2 is similar to that of Embodiment 1, and as such, it is not specifically described.

The sucking plate 11, which has a contact surface that makes contact with the support plate 7, holds the support plate 7 by suction. It is preferable that the contact surface of the sucking plate 11 be substantially identical in planar shape to the support plate 7. As illustrated in FIGS. 5 and 6, the sucking plate 11 is provided with the sucking holes 12 and 12' via which gas is sucked from a space between the contact surface of the sucking plate 11 and the support plate 7. The sucking holes 12 and 12', via which the gas is sucked from the space between the contact surface of the sucking plate 11 and the support plate 7, serve to cause the support plate 7 to be held by the suction power with which the gas is sucked. Accordingly, the diameter of an opening of each of the sucking holes 12 and 12' ranges from 10 mm to 30 mm.

In the present embodiment, the sucking hole 12, provided in a surface of the sucking plate 11 opposite to its surface that makes contact with the support plate 7, is connected to sucking means such as an injector (not illustrated). Specifically, this sucking means is operated to suck the gas from the space between the contact surface of the sucking plate 11 and the support plate 7 via the sucking hole 12' and exhaust the gas via the sucking hole 12, whereby the gas is expelled from the space between the contact surface of the sucking plate 11 and the support plate 7 and the support plate 7 is held by the suction power with which the gas is expelled. Furthermore, even in cases where a dissolving liquid infused in dissolving an adhesive is led into a space between the support plate 7 and the sucking plate 11 by surface tension, the dissolving liquid can be discharged via the sucking hole 12 by the suction power.

As illustrated in FIG. 5, in the present embodiment, the sucking hole 12, provided in a surface of the sucking plate 11 opposite to its surface that makes contact with the support plate 7, is communicated with three sucking holes 12' provided in the contact surface of the sucking plate 11. A sucking hole 12, provided in the surface of the sucking plate 11 opposite to its surface that makes contact with the support plate 7, and a sucking holes 12', provided in the contact surface of the sucking plate 11, may form a single through hole. Further, it is possible to provide a plurality of such through holes. Moreover, the sucking holes 12 and 12' are not particularly limited in location where they are provided. The sucking holes 12 and 12' may be provided, for example, in the vicinity of the center of the sucking plate 11 corresponding to the center of the support plate 7 so that the support plate 7 can be suitably held by suction.

In separating the support plate 7 from the wafer 6, the separating apparatus 10 uses the sucking plate 11 to hold the support plate 7 by suction, and then uses the clamp 2 to grip the outer peripheral end of the support plate 7 held by the sucking plate 11. That is, the separating apparatus 10 supports the support plate 7 by moving the clamp 2 toward the outer peripheral end of the support plate 7 and sticking the sucking plate 11 to the support plate 7 by suction before using the clamp 2 to grip the support plate 7. With this, the support plate 7 can be securely gripped by the clamp 2.

Also in the present embodiment, the support plate 7 has a plurality of through holes passing therethrough in a thickness direction thereof. Gas to be supplied to the support plate 7 via the gas inlet 13 provided in the sucking plate 11 as the gas supply means is supplied into a space between the support plate 7 and the wafer 6 via the through holes. In the present embodiment, as illustrated in FIGS. 5 and 6, the gas inlet 13 is provided so as to pass through the sucking plate 11 from a side surface of the sucking plate 11 to the contact surface of the sucking plate 11. However, the gas inlet 13 may be provided so as to pass through the sucking plate 11 from (i) a surface of the sucking plate 11 opposite to the contact surface of the sucking plate 11 to (ii) the contact surface of the sucking plate 11, as long as the gas inlet 13 is provided in a position where the gas can be supplied without prevention of suction via the sucking holes 12 and 12'.

It should be noted here that the support plate 7 may have the through holes formed on an entire surface thereof and also partially have a sucked section having no through hole formed therein. In the present embodiment, the separating apparatus 10 sucks the gas from the space between the contact surface of the sucking plate 11 and sticks to the support plate 7 by the suction power with which the separating apparatus sucks the gas from the space between the support plate 7 and the contact surface of the sucking plate 11. This makes it unnecessary to decompress the space between the contact surface of the sucking plate 11 and the support plate 7. Therefore, the sucked section does not need to be formed on the support plate 7.

In cases where the support plate 7 having through holes is used, a dissolving liquid for dissolving an adhesive with which the support plate 7 has been attached to the wafer is supplied from (i) a surface of the support plate 7 opposite to its surface that makes contact with the wafer 6 to (ii) the adhesive via the through holes. At this time, if the through holes are formed throughout the support plate 7, the dissolving liquid can be more efficiently supplied to the adhesive and thus the adhesive can be dissolved more rapidly. As a result, the support plate 7 can be separated from the wafer 6 in a shorter time.

(Separating Method)

A separating method that involves the use of the separating apparatus 10 according to the present embodiment is practiced similarly to the separating method of Embodiment 1, other than the step of sticking to the support plate 7 by suction. Therefore, the steps other than the step of sticking to the support plate 7 by suction are not specifically described.

In the separating method of the present embodiment, the step of sticking to the support plate 7 by suction is as follows: After a laminate constituted by the wafer 6, the support plate 7, and the dicing tape 8 is fixed on the stage 9, suction is started by the sucking means; and the sucking plate 11 provided with the clamp 2 is placed above the support plate 7 so that the support plate 7 and the contact surface of the sucking plate 11 face each other. In the subsequent step, when the sticking of the inner peripheral side of the dicing tape 8 to the stage 9 by decompression suction is released, the suction power by the sucking means causes the support plate 7 to stick to the sucking plate 11 by suction. Then the support plate 7, sticking to the sucking plate 11 by suction, is gripped by the clamp 2, and then separated from the wafer 6 in the same manner as in Embodiment 1.

The present invention is not limited to the description of the embodiments above, but may be altered by a skilled person within the scope of the claims. An embodiment based on a proper combination of technical means disclosed in different embodiments is encompassed in the technical scope of the present invention.

A separating apparatus according to the present invention includes gripping means for gripping an outer peripheral end of a supporting plate, and therefore can easily separate the supporting plate from a substrate to which the supporting plate has been attached, without breaking the substrate.

Since the separating apparatus according to the present invention can easily separate a supporting plate from a substrate without breaking the substrate, the separating apparatus can be suitably applied, for example, to manufacture of miniaturized semiconductor devices.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

The invention claimed is:

1. A separating apparatus for separating a supporting plate from a substrate to which the supporting plate has been attached, comprising:
   a plurality of gripping devices configured to grip an outer peripheral end of the supporting plate, each of the plurality of gripping devices configured to grip the supporting plate;
   a plurality of cylinders, wherein each cylinder is configured to individually move each gripping device in a linear horizontal direction toward or away from the supporting plate; and
   a sucking device configured to adhere to the supporting plate by suction,
   wherein the surface of the supporting plate is attached to the substrate,
   wherein the outer peripheral end of the supporting plate has a chamfered portion,
   wherein each of the gripping devices comprises a clamp having a vertical surface facing the supporting plate and a claw having a surface declined away from the vertical surface toward the supporting plate to grip the chamfered portion of the outer peripheral end,
   wherein the plurality of gripping devices is configured to grip the outer peripheral end of the supporting plate to which the sucking device has adhered by suction, and
   wherein each of the cylinders is capable of individually controlling each of the gripping devices comprising a clamp so that a displacement angle of the clamp with respect to a direction orthogonal to the surface of the supporting plate is capable of being set to a predetermined angle.

2. The separating apparatus as set forth in claim 1, wherein the supporting plate is a supporting plate having a plurality of through holes passing therethrough in a thickness direction thereof, the separating apparatus further comprising a gas supply device configured to supply gas into a space between the supporting plate and the substrate via the plurality of through holes.

3. The separating apparatus as set forth in claim 2, wherein the plurality of gripping devices is configured to separate the supporting plate from the substrate after or at the same time as the gas supply device starts supplying the gas.

4. The separating apparatus as set forth in claim 1, wherein:
   the sucking device has an opening via which gas is exhausted from a space between the sucking device and the supporting plate; and
   the opening has a diameter of 10 mm to 30 mm.

5. The separating apparatus as set forth in claim 1, wherein each of the plurality of gripping devices is configured to grip the supporting plate without making contact with the substrate.

6. The separating apparatus as set forth in claim 1, which comprises three gripping devices spaced at regular intervals.

7. The separating apparatus as set forth in claim 1, wherein each of the cylinders comprises a regulator for controlling contact force between the plurality of gripping devices and the outer peripheral end of the support plate.

* * * * *